United States Patent
Daugherty et al.

(10) Patent No.: US 6,821,378 B1
(45) Date of Patent: Nov. 23, 2004

(54) PUMP BAFFLE AND SCREEN TO IMPROVE ETCH UNIFORMITY

(75) Inventors: John Daugherty, Newark, CA (US); Neil Benjamin, Palo Alto, CA (US); Song Huang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 116 days.

(21) Appl. No.: 10/155,061

(22) Filed: May 25, 2002

Related U.S. Application Data (60) Provisional application No. 60/293,804, filed on May 25, 2001.

(51) Int. Cl.[7] .................. H01L 21/306; C23C 16/00; C23C 14/00
(52) U.S. Cl. .................. 156/345.29; 156/345.37; 118/715; 118/724; 204/298.07
(58) Field of Search .................. 156/345.29, 345.37; 118/715, 724, 728; 204/298.07

(56) References Cited

U.S. PATENT DOCUMENTS

| | | | |
|---|---|---|---|
| 4,217,856 A | * 8/1980 | Kraus | 118/724 |
| 5,165,548 A | * 11/1992 | Dumler et al. | 209/2 |
| 5,935,336 A | * 8/1999 | Sandhu et al. | 118/723 IR |
| 6,022,461 A | * 2/2000 | Kobayashi et al. | 204/298.07 |
| 6,156,151 A | * 12/2000 | Komino et al. | 156/345.29 |
| 6,264,788 B1 | * 7/2001 | Tomoyasu et al. | 156/345.43 |
| 6,394,026 B1 | * 5/2002 | Wicker et al. | 156/345.1 |
| 6,407,367 B1 | * 6/2002 | Ito et al. | 219/390 |
| 6,475,286 B1 | * 11/2002 | Frijlink | 118/719 |
| 6,513,452 B2 | * 2/2003 | Shan et al. | 118/723 E |
| 6,579,372 B2 | * 6/2003 | Park | 118/715 |

* cited by examiner

Primary Examiner—Jeffrie R. Lund
(74) Attorney, Agent, or Firm—IP Strategy Group PC (57) ABSTRACT

A cylindrical pump baffle fitted to a semiconductor processing chamber is disclosed. The pump baffle contains a screen with bores therethrough to allow process gasses from the process chamber to be exhausted from the chamber at a reduced rate. This decreases process discrepancies to the wafer due to the prejudice of gas concentration as a result of the pressure differential imposed upon the gas and thereby the wafer brought about by the rapid and relatively unimpeded exit flow of process gasses when no restrictive member is in place. The pump baffle is also machined such that it does not block the placement and removal of wafers by the platform robot arm.

21 Claims, 10 Drawing Sheets

PUMP BAFFLE AND SCREEN TO IMPROVE ETCH UNIFORMITY

CROSS REFERENCE TO RELATED APPLICATIONS

This application claims priority from prior U.S. Provisional Patent Application No. 60/293,804 filed May 25, 2001 and entitled "Pump Baffle and Screen to Improve Etch Uniformity."

BACKGROUND OF THE INVENTION

1. Field of the Invention

The present invention relates to semiconductor processing equipment, and more particularly, to a pump baffle and screen used to improve etch uniformity for processes utilized on that equipment.

2. Description of the Related Art

Two of the most common types of semiconductor processes are plasma etch and deposition. These processes are accomplished via the use of a sealed chamber wherein the silicon wafer or workpiece is transported into the chamber and is exposed to a variety of process gasses to perform various types of operations upon the workpiece. The process gasses are removed from the chamber via a pump. Many of the pumps in plasma etch and deposition chambers are asymmetrically located. That is, the location of the pump is such that gas exits the chamber on one side of the wafer or workpiece as opposed to symmetrically on all sides of the wafer. This asymmetric pumping can result in non-uniform etch rate or deposition rate because of the changing concentration of reacting species as the gas flows towards the pump.

Figure 1:
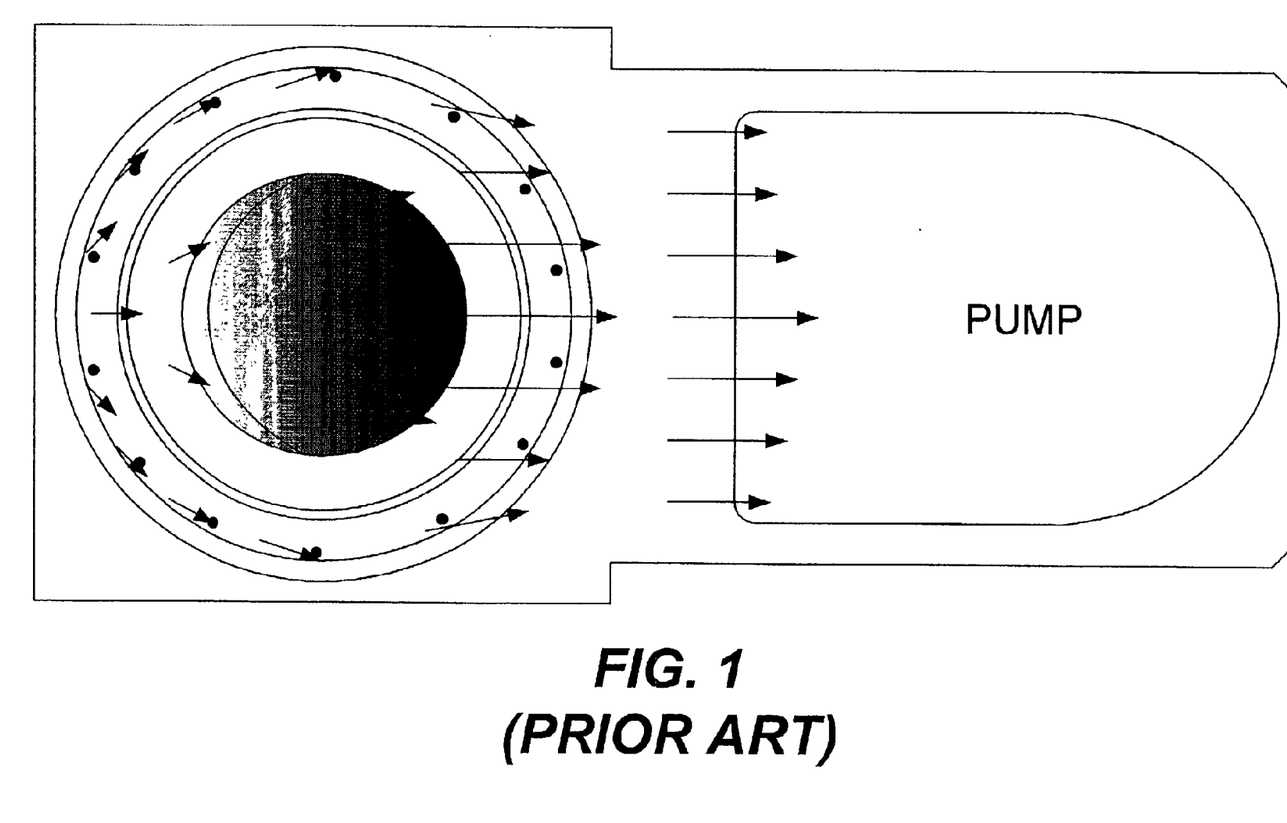
FIG. 1 is a diagram of a process chamber showing how asymmetric pumping affects etch rate uniformity of a silicon nitride wafer.

Asymmetric pumping can also result in non-uniform plasma density and electrical potential across the wafer since the pump port represents a location on the boundary of the plasma where there is a non-solid wall. Plasma may stream into this discontinuity in the wall and cause a disruption in the potential or density profile that is characteristic of the rest of the chamber's perimeter. FIG. 1 shows a typical etch rate map from an asymmetrically pumped chamber. It suggests that the presence of the pump port causes a non-uniform etch pattern that is aligned with the pump port. The arrows in the figure show the approximate direction of the gas flow as it exits the chamber through the pump port on the right.

One way to solve the asymmetric pumping effect is to design a chamber where the gas is pumped symmetrically around the entire perimeter of the wafer, often by placing the pump symmetrical to the workpiece. However, due to other design considerations this may not always be practical and this pump re-arrangement is not feasible in already existing chambers.

Accordingly, the present invention relates to a pump baffle and screen which can as a retrofit be placed in existing chambers or designed into new chambers to improve uniformity when asymmetric pump effect is a factor.

SUMMARY OF THE INVENTION

The present invention provides a pump baffle and screen that partially blocks the pump port. The baffle causes a flow restriction that reduces the asymmetric pumping effect. The baffle also provides enough wall surface area across the pump port to reduce the electrical irregularities caused by the abrupt discontinuation of the solid wall.

BRIEF DESCRIPTION OF THE DRAWINGS

The present invention will now be described by way of example with reference to the accompanying drawings wherein.

DETAILED DESCRIPTION OF THE PREFERRED EMBODIMENTS

The present invention will now be described in detail with reference to a few preferred embodiments thereof as illustrated in the accompanying drawings. In the following descriptions, numerous specific details are set forth in order to provide a thorough understanding of the present invention. It will be apparent, however, to one skilled in the art that the present invention may be practiced without some or all of these specific details. In other instances, well known process steps and/or structures have not been described in detail in order to not unnecessarily obscure the present invention.

Figure 2:
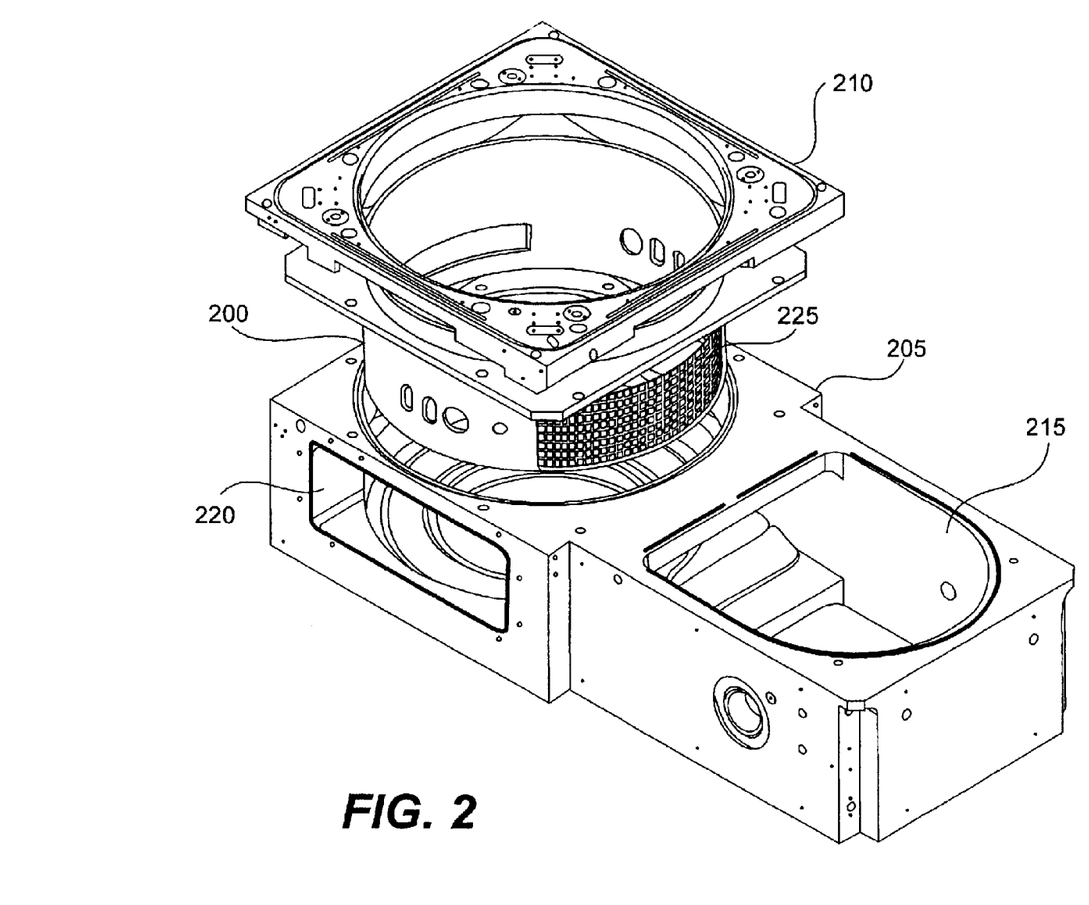
FIG. 2 is an exploded isometric view of a chamber assembly of the present invention showing the chamber housing, the chamber liner and the adapter plate.

To facilitate discussion, FIG. 2 is an exploded view of the invention as it is designed to be incorporated into a chamber housing. The chamber liner 200, fits snugly into the chamber housing 205 and is secured to the housing by the adapter plate 210. The adjacent chamber pump port is shown as 215 and the view port window is shown as 220. The screen baffle portion of the chamber liner is shown as 225.

Figure 3:
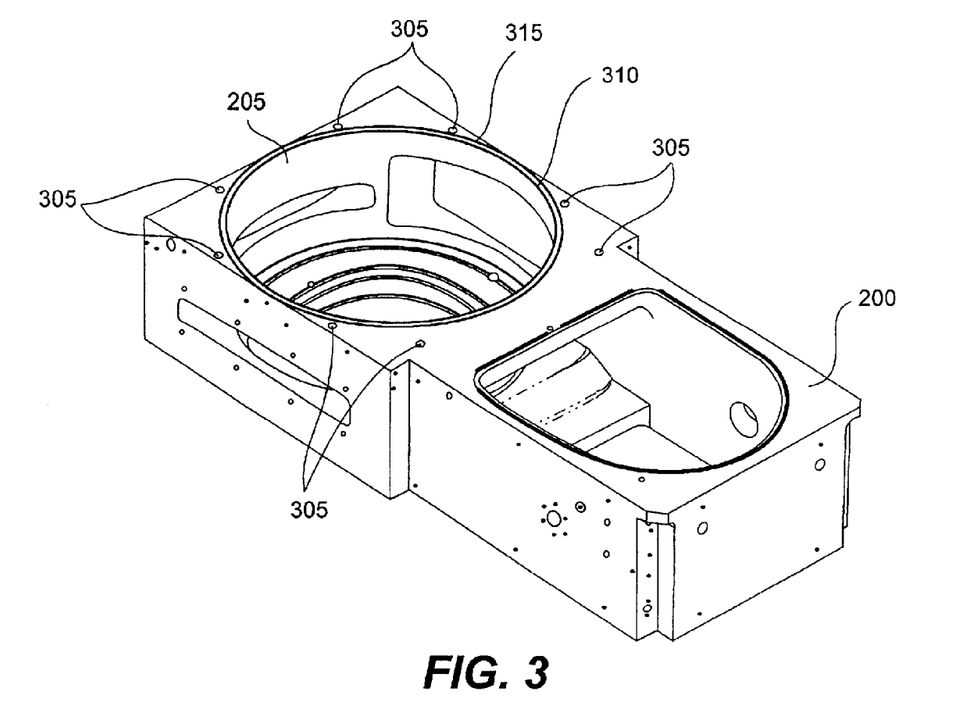
FIG. 3 is an isometric view of the chamber housing.

FIG. 3 shows an isometric view of the chamber housing 200 with chamber opening 205 and wafer opening 210. The chamber housing contains bolt holes 305 to allow the complete screen baffle apparatus to be securely and thermally attached to the chamber housing. The chamber housing also contains a dovetailed groove 310 to allow for the placement of a vacuum o-ring (comprised of any general elastomer type material, for example Viton) for sealing purposes and a polished ring portion 315 to allow for proper seating of a RF gasket.

Figure 4:
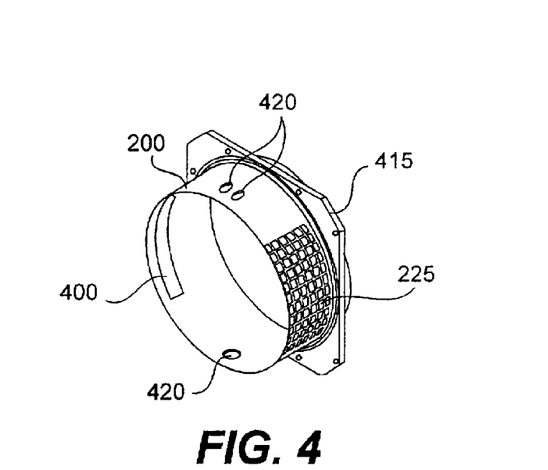
FIG. 4 is an isometric view of the chamber liner.

FIG. 4 shows an isometric view of the chamber liner 200. Shown is the wafer slot insertion opening 400 to accommodate wafer placement therethrough. The screen portion of the chamber liner is shown as 225. One of the difficulties with liner design is that liner temperature is not controlled.

Since the liner sits in a vacuum, little heat is conducted to the walls of the chamber, and therefore, the liner heats up when exposed to plasma. This temperature change can be an important cause of process drift.

In the preferred embodiment, the liner design includes a broad horizontal tang or flange 415 that is clamped between two parts of the chamber (the main reaction chamber and the adapter plate). Any heat delivered from the plasma is conducted to the main chamber body through the tang or flange. Since the chamber temperature is controlled with cartridge heaters and an active temperature controller (not shown), the liner and the screen are held at the same temperature as the controller. Flange or tang portion 415 also allows the liner to be securely fastened to the chamber housing while also allowing thermal conductance such that the liner has thermal expansion and contraction reactions consistent with the chamber housing. Alternatively the liner could be actively heated or cooled with any variety of heating/cooling methods.

The chamber liner 200 can be typically manufactured from anodized aluminum and coated with a variety of resistant and process dependent favorable coatings including yttria, quartz and alumina. In a preferred embodiment, multiple chamber liners of varying coatings, all exhibiting process specific features can be interchanged in order to maximize chamber performance for a particular purpose. If necessary, access holes 420 can be machined through the chamber liner to allow for various endpointing access.

Figure 5A:
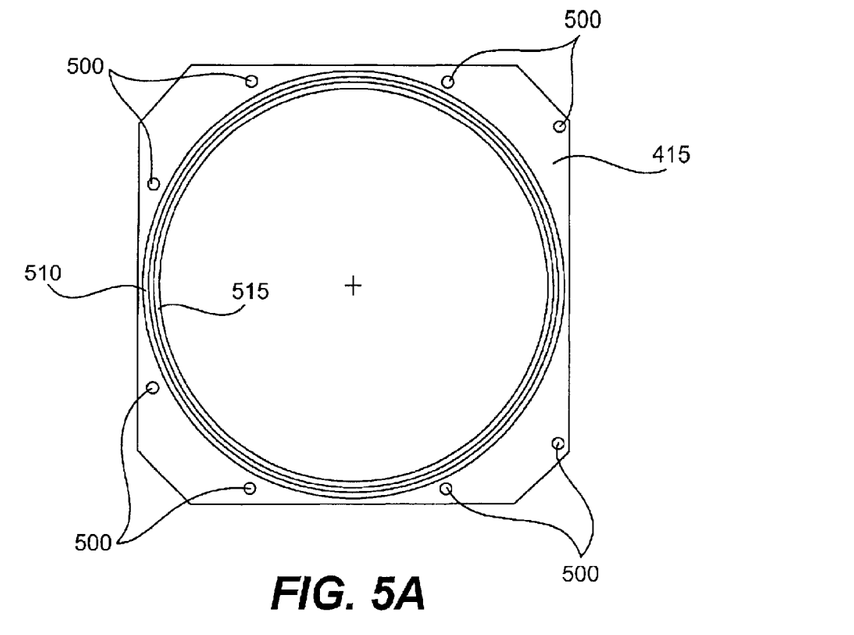
FIG. 5a shows a top view of the chamber liner.
Figure 5B:
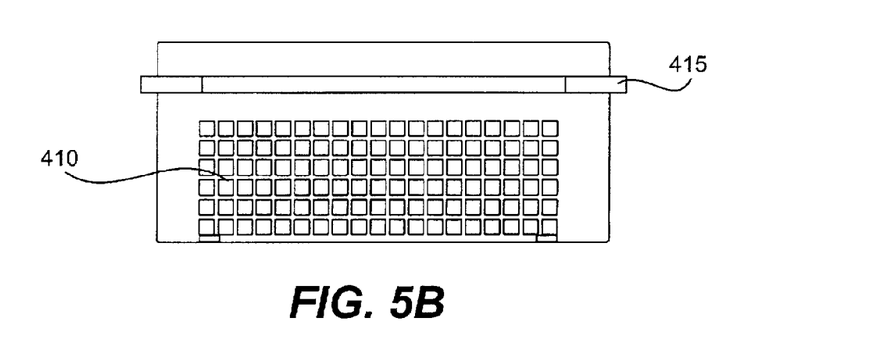
FIGS. 5b and 5c show two side views of the chamber liner, 5a a frontal view exposing the entire screen and 5ba side view showing a partial view of the screen and a partial view of the wafer insertion slot.
Figure 5C:
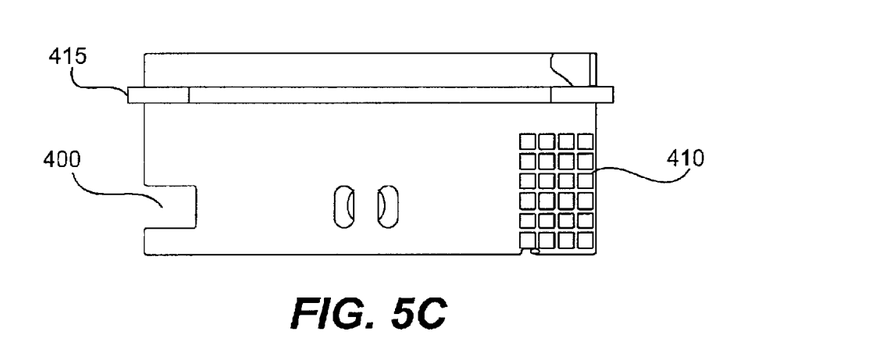

FIG. 5a shows a top views of the chamber liner with bolt holes 500 and flange (or tang) portion 415. Two polished ring portions of the chamber liner are shown as 510 and 515. The polished rings allow for proper seating of either the previously mentioned vacuum o-ring or RF gasket. The RF gasket is ideally placed outside of the o-ring gasket to avoid degradation from exposure to the plasma gasses. FIG. 5b shows a side view of the chamber liner with the screened baffle portion 410 fully exposed. The screened baffle portion of the liner should be the approximate dimension of the pump port opening. FIG. 5c shows a side view of the liner exposing a portion of the wafer insertion opening 400 and a portion of the screen baffle 410.

Figure 6:
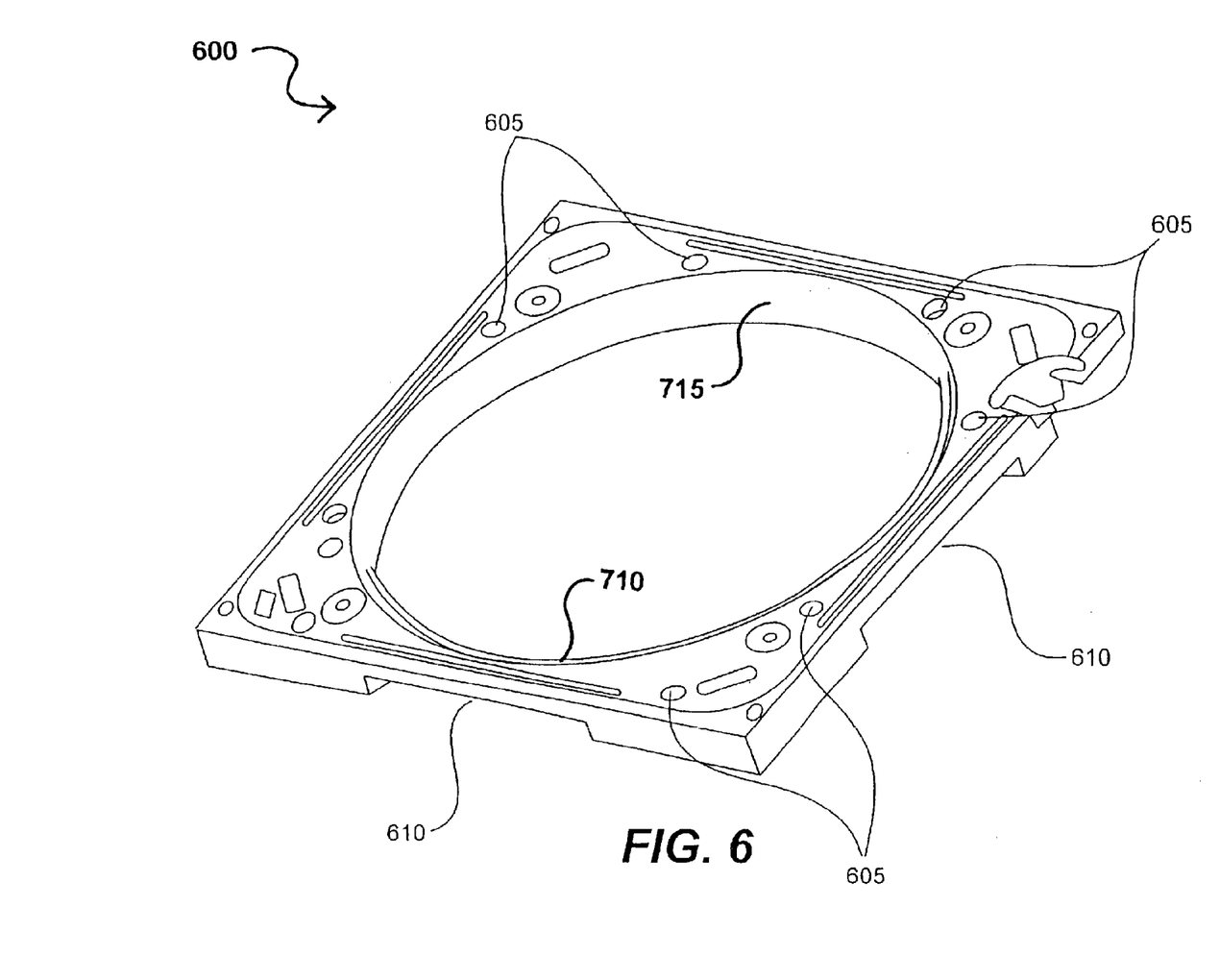
FIG. 6 is an isometric view of the adapter plate.
Figure 7A:
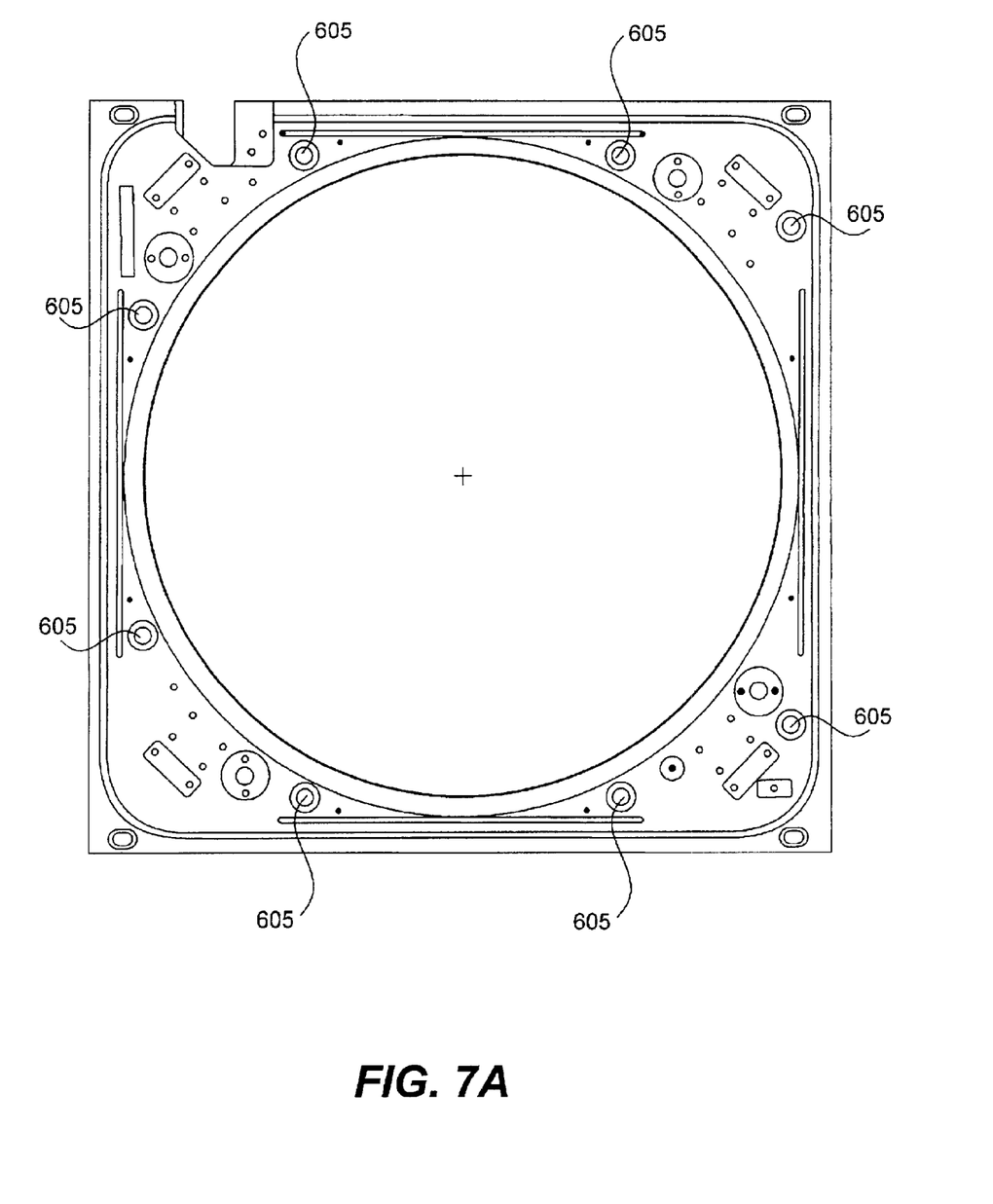
FIG. 7a shows a top view of the adapter plate.
Figure 7B:
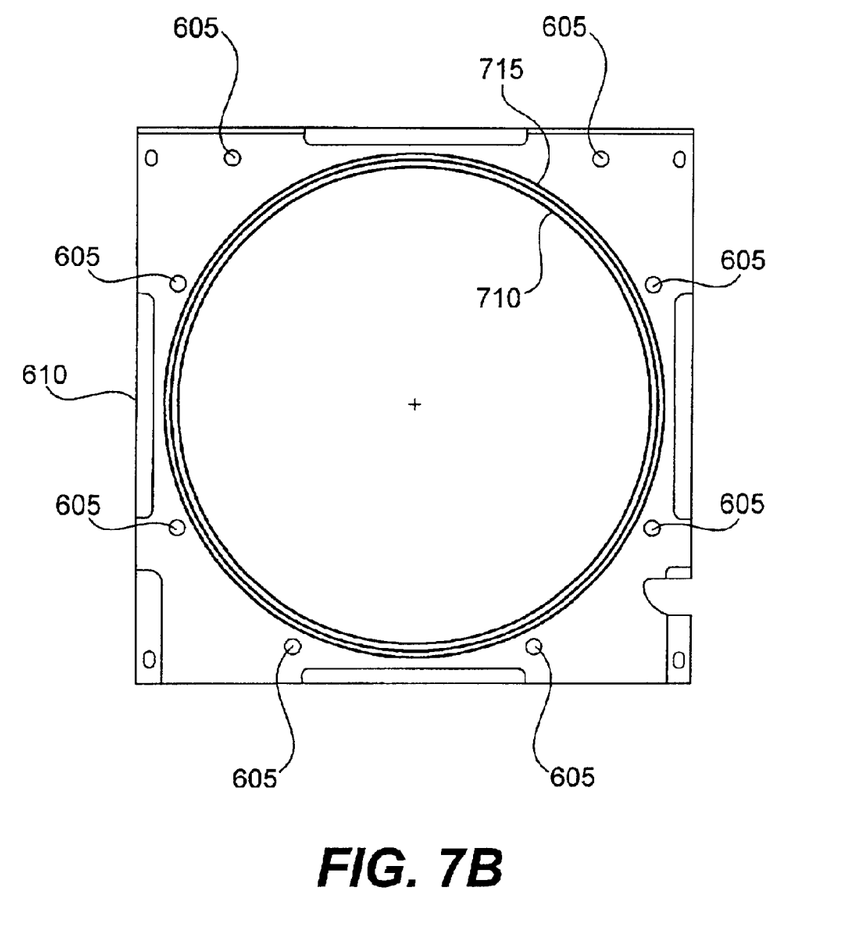
FIG. 7b shows a bottom view of the adapter plate.
Figure 7C:
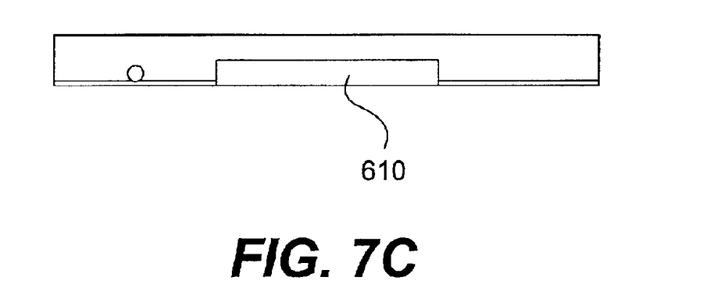
FIG. 7c show a side view of the adapter plate.

FIG. 6 shows an isometric view of the adapter plate 600. Nominally the adapter plate is also comprised of anodized aluminum and has bolt holes 605 to accommodate bolting of the entire assembly to the chamber housing and to facilitate thermal conductance. The adapter plate has slots or handles 610 machined therein for easy operator assembly, handling and manipulation. FIG. 7a is top view of the adapter plate showing bolt holes 605. FIG. 7b shows a bottom view with the inner dovetail groove 710 shown to accommodate the aforementioned vacuum o-ring as well as a polished ring portion 715 to facilitate seating of the RF gasket. FIG. 7c shows a side view of the adapter plate with the handle hold groove.

Figure 8:
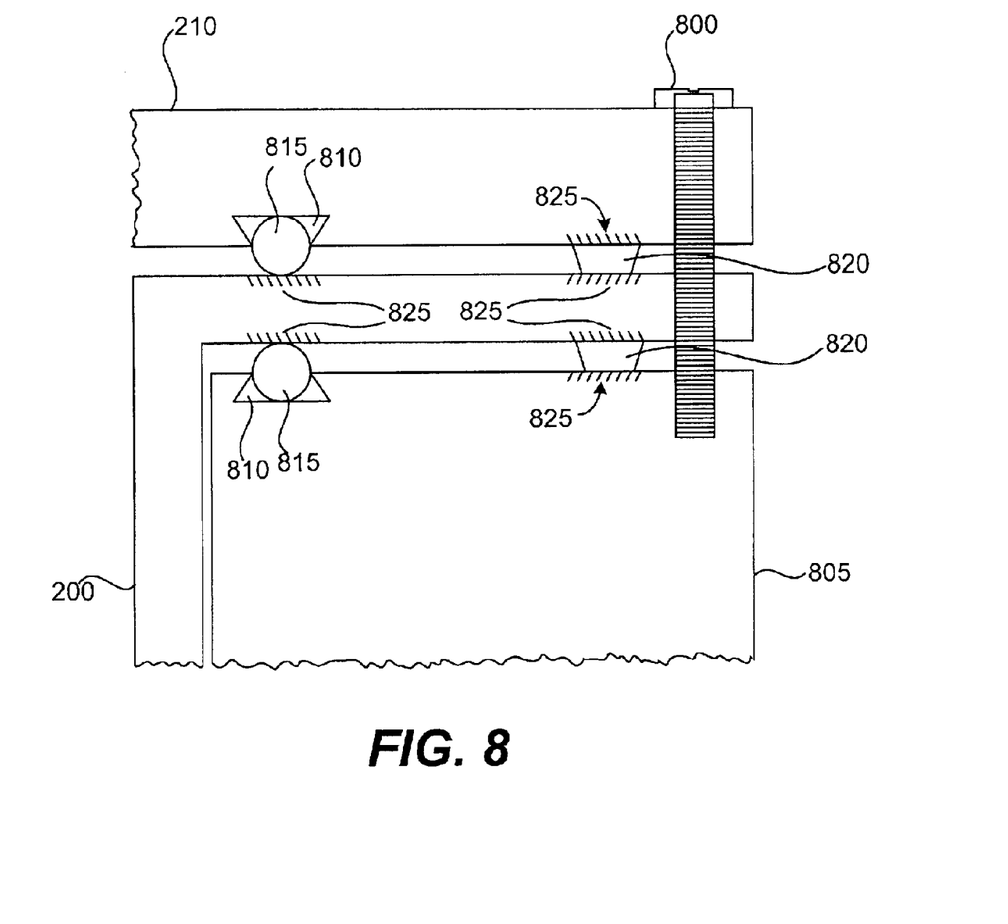
FIG. 8 shows a cross section view of an installed chamber liner and adapter plate.

FIG. 8 shows a cross sectional view (not to scale) of an installed chamber liner 200. As shown, a bolt 800 securely fastens the adapter plate 200 to the chamber housing wall 805 through the chamber liner 200. Both the adapter plate 210 and the chamber liner wall 805 have dovetail joints 810 machined therethrough to facilitate the placement of the vacuum o-ring 815. RF gaskets are shown as 820 and polished metal portions 825 to allow for ring seating a present where either o-rings or RF gaskets come into contact with either the adapter plate, the chamber liner or the chamber housing.

Figure 9A:
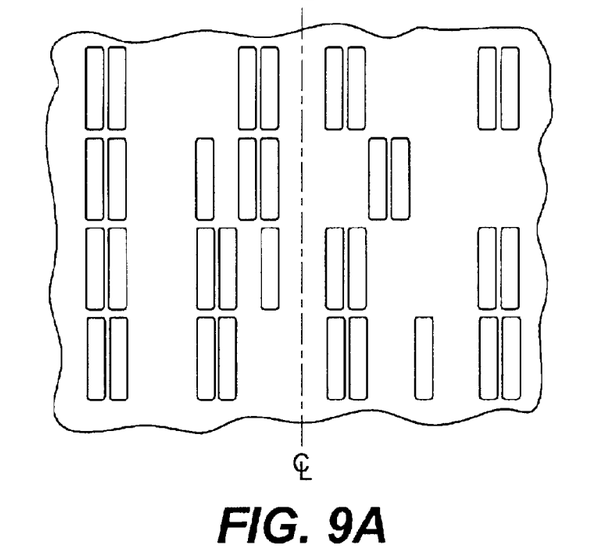
FIG. 9a and 9b shows two liner-screen designs.
Figure 9B:
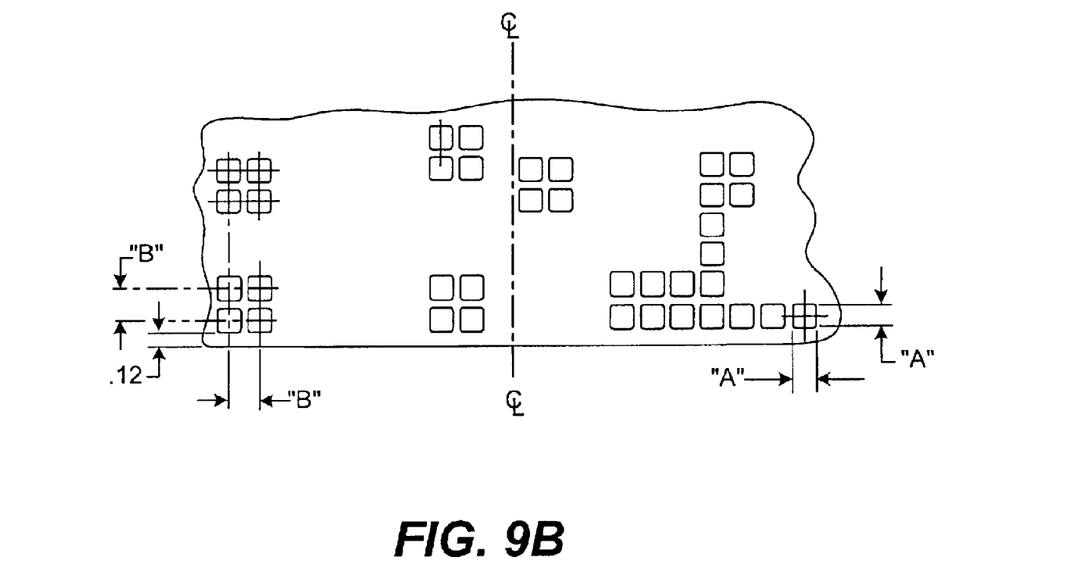

FIG. 9a and 9b show two possible hole designs of the many possible variations in the design of the baffle or screen portion of the liner. Although there are various design considerations the one which has critical effect on uniformity results is simple "pass through" percentage; i.e., that percentage of screen area which does not contain screen material allowing gas or any other type of medium passage therethrough. As shown by the results given in FIG. 10, more than anything, the smaller the pass through percentage, (i.e. the more restrained the pump flow becomes), the more uniform the etching results become. Greater pass through percentage results in decreasing etch uniformity. Slots or rounds holes are also available as an alternative to the square holes depicted and may easier coatability.

Figure 10:
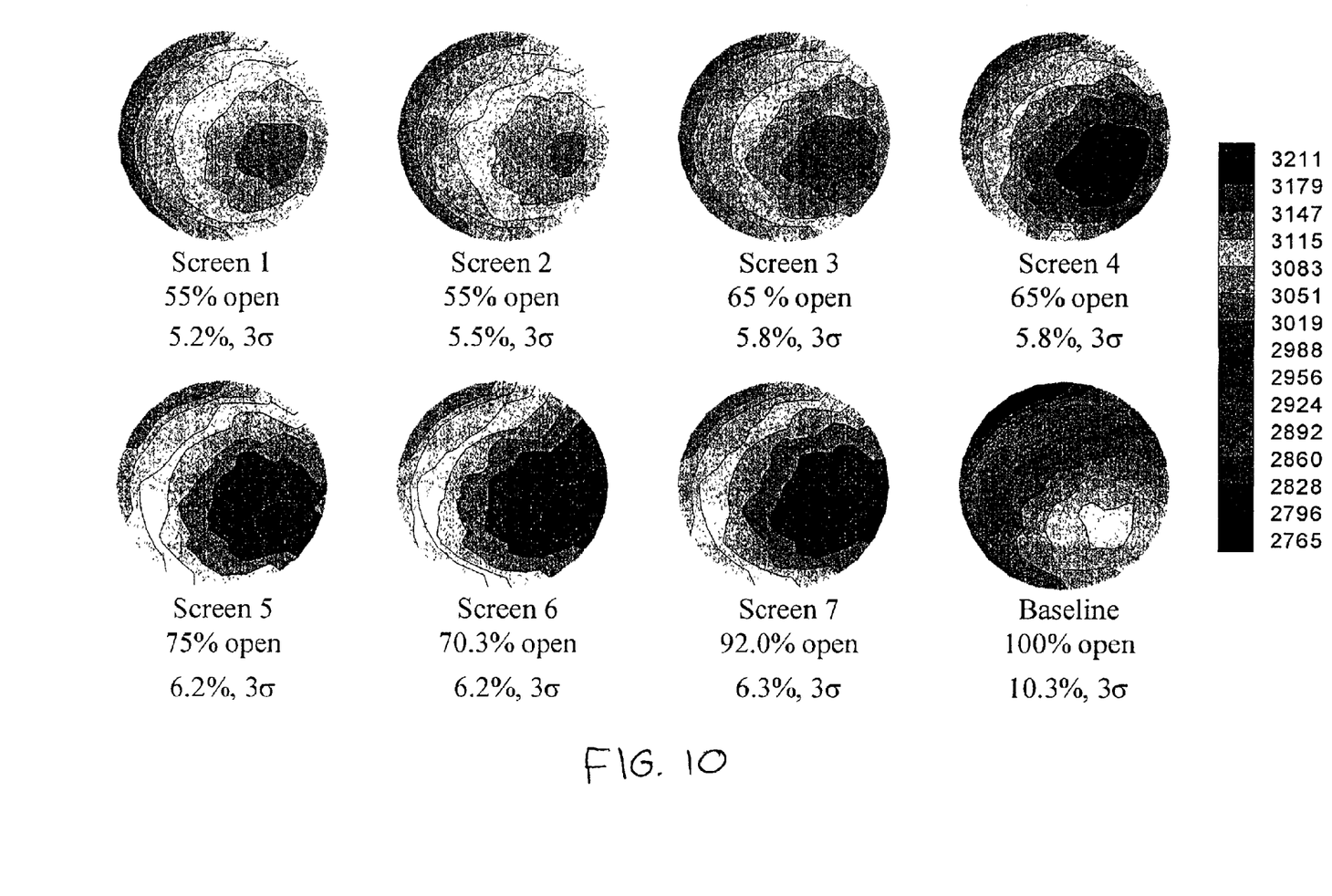
FIG. 10 shows various graphs displaying the results of various liner screens in tests measuring uniformity performance.

Several versions of the liner were tested with different hole pitches (dimension B), and different hole sizes (dimension "A"). Also tested were long vertical slots as shown in FIG. 9b Different combinations of "A" and "B" were also tested which represented screen transparencies from 50% to 90%. A tabulation of these dimensions is shown in Table 1. As can be seen in FIG. 10, all combinations of "A" and "B" shown in Table 1produced a significant improvement in etch uniformity. Sample test results for a typical nitride hardmask etch process are shown in FIG. 10. The improvement in etch uniformity for this process is nearly 50% for the screen with the smallest transparency.

TABLE 1

SCREEN DIMENSIONS

| "A" | "B" | Open area percentage $(A/B)^2$ |
|---|---|---|
| 0.188 | 0.249 | 57% |
| 0.250 | 0.334 | 56% |
| 0.250 | 0.307 | 66% |
| 0.375 | 0.453 | 68% |
| 0.375 | 0.431 | 76% |

What is claimed is:

1. A process chamber pressure mediating apparatus in a process chamber, comprised of an insert placed within said process chamber, said insert comprising a circular ring having a screen disposed on only one side of said circular ring such that the gas flow of said chamber is restricted, said insert further including a flange configured to facilitate fastening of said insert to said process chamber.

2. The process chamber pressure mediating apparatus of claim 1 wherein said cylinder is coated with one of the following materials: yttria, alumina, syria, quartz, anodized aluminum.

3. The process chamber pressure mediating apparatus of claim 1 wherein said screen is approximately the same dimension as the port to be baffled.

4. The process chamber pressure mediating apparatus of claim 1 wherein said flange is placed at approximately the same height from the bottom of the circular ring as the height of the process chamber such that said circular ring can be fastened to the top of said process chamber by said flange.

5. The process chamber of claim 4 wherein said screen is approximately the same dimension as the port to be baffled.

6. A plasma processing chamber comprising:
    means for housing a gaseous medium used for etching;
    an interaction space where a plasma capable of etching a workpiece is generated;
    a means for restricting gas flow when said means for housing a gaseous medium is evacuated of said gaseous medium, said means for restricting gas flow comprising a circular ring having a screen disposed only on one side of said circular ring and a flange configured to facilitate fastening of said insert to said plasma processing chamber.

7. The plasma processing chamber of claim 6 wherein said screen is approximately the same dimension as a port to be baffled.

8. The plasma processing chamber of claim 6 wherein said flange is placed at approximately the same height from the bottom of the circular ring as the height of the process chamber such that said circular ring can be fastened to the top of said process chamber by said flange.

9. The plasma processing chamber of claim 8 wherein said screen is approximately the same dimension as the port to be baffled.

10. The replacement gas baffle liner of claim 6 wherein said circular ring includes yttria.

11. The replacement gas baffle liner of claim 6 wherein said circular ring includes alumina.

12. The replacement gas baffle liner of claim 6 wherein said circular ring includes syria.

13. The replacement gas baffle liner of claim 6 wherein said circular ring is includes quartz.

14. The replacement gas baffle liner of claim 6 wherein said circular ring includes anodized aluminum.

15. A replacement gas baffle liner for a plasma process chamber comprised of:

a circular ring;

a screen disposed on one side of said circular ring approximately the same dimension as the port meant to be baffled, said circular ring containing a flange placed at approximately the same height from the bottom of said circular ring as the height of the plasma processing chamber such that said circular ring can be fastened to the top of said process chamber by said flange.

16. The replacement gas baffle liner of claim 15 wherein said flange also facilitates heat transfer from said liner to a chamber housing of said plasma processing, chamber.

17. The replacement gas baffle liner of claim 15 wherein said circular includes yttria.

18. The replacement gas baffle liner of claim 15 wherein said circular ring includes alumina.

19. The replacement gas baffle liner of claim 15 wherein said circular ring includes syria.

20. The replacement gas baffle liner of claim 15 wherein said circular ring includes quartz.

21. The replacement gas baffle liner of claim 15 wherein said circular ring includes anodized aluminum.

\* \* \* \* \*

UNITED STATES PATENT AND TRADEMARK OFFICE
CERTIFICATE OF CORRECTION

PATENT NO.    : 6,821,378 B1
DATED         : November 23, 2004
INVENTOR(S)   : Daugherty et al.

It is certified that error appears in the above-identified patent and that said Letters Patent is hereby corrected as shown below:

<u>Title page,</u>
Item [22], Filing Date, should read -- May 23, 2002 --

Signed and Sealed this

First Day of March, 2005

JON W. DUDAS
*Director of the United States Patent and Trademark Office*